United States Patent
Goto et al.

(10) Patent No.: US 9,362,426 B2
(45) Date of Patent: Jun. 7, 2016

(54) PHOTOELECTRIC CONVERSION DEVICE AND METHOD FOR PRODUCING SAME

(71) Applicant: SANYO Electric Co., Ltd., Osaka (JP)

(72) Inventors: Ryo Goto, Hyogo (JP); Satoru Shimada, Hyogo (JP); Masato Shigematsu, Osaka (JP); Hitoshi Sakata, Osaka (JP); Daisuke Ide, Hyogo (JP)

(73) Assignee: PANASONIC INTELLECTUAL PROPERTY MANAGEMENT CO., LTD. (JP)

( * ) Notice: Subject to any disclaimer, the term of this patent is extended or adjusted under 35 U.S.C. 154(b) by 215 days.

(21) Appl. No.: 14/032,986

(22) Filed: Sep. 20, 2013

(65) Prior Publication Data

US 2014/0020753 A1  Jan. 23, 2014

Related U.S. Application Data

(63) Continuation of application No. PCT/JP2012/056257, filed on Mar. 12, 2012.

(30) Foreign Application Priority Data

Mar. 25, 2011 (JP) ................. 2011-067158

(51) Int. Cl.
| | |
|---|---|
| *H01L 31/18* | (2006.01) |
| *H01L 31/0224* | (2006.01) |
| *H01L 31/0352* | (2006.01) |
| *H01L 31/068* | (2012.01) |
| *H01L 31/0747* | (2012.01) |
| *H01L 31/20* | (2006.01) |

(52) U.S. Cl.
CPC .. *H01L 31/022441* (2013.01); *H01L 31/03529* (2013.01); *H01L 31/0682* (2013.01); *H01L 31/0747* (2013.01); *H01L 31/202* (2013.01); *H01L 31/18* (2013.01); *Y02E 10/547* (2013.01); *Y02P 70/521* (2015.11)

(58) Field of Classification Search
CPC ............... H01L 31/022441; H01L 31/03529; H01L 31/0682; H01L 31/202; H01L 31/0747; H01L 31/18; Y02P 70/521; Y02E 10/547
USPC .......................................... 136/256; 438/96
See application file for complete search history.

(56) References Cited

U.S. PATENT DOCUMENTS

2010/0132792 A1* 6/2010 Kim ................ H01L 31/022425
  136/258
2011/0132441 A1 6/2011 Asaumi et al.

FOREIGN PATENT DOCUMENTS

| JP | 2009188355 A | 8/2009 | |
|---|---|---|---|
| JP | 2009200267 A | 9/2009 | |
| JP | 2010010620 A | 1/2010 | |
| JP | 2010147324 A | 7/2010 | |
| WO | WO 2011093329 A1 * | 8/2011 | ...... H01L 31/035281 |

* cited by examiner

*Primary Examiner* — Matthew Martin
(74) *Attorney, Agent, or Firm* — Cantor Colburn LLP

(57) ABSTRACT

This photoelectric conversion device (10) is provided with: an n-type monocrystalline silicon substrate (21); an IN layer (25) and an IP layer (26) formed on the back surface of the n-type monocrystalline silicon substrate (21); an n-side electrode (40) containing an n-side underlayer (43), an n-side primary conductive layer (44), and an n-side protective layer (45); and a p-side electrode (50) containing a p-side underlayer (53), a p-side primary conductive layer (54), and a p-side protective layer (55). The n-side primary conductive layer (44) is formed in a manner so as not to cover the lateral surface of the n-side underlayer (43), and is covered at the lateral surface by the n-side protective layer (45). The p-side electrode (50) is formed in such a manner the lateral surface of the p-side underlayer (53) is not covered, and the lateral surface is covered by the p-side protective layer (55).

10 Claims, 8 Drawing Sheets

PHOTOELECTRIC CONVERSION DEVICE AND METHOD FOR PRODUCING SAME

CROSS-REFERENCE TO RELATED APPLICATION

The present application is a continuation under 35 U.S.C. §120 of PCT/JP2012/056257, filed Mar. 12, 2012, which is incorporated herein by reference and which claimed priority to Japanese Patent Application No. 2011-067158 filed Mar. 25, 2011. The present application likewise claims priority under U.S.C. §119 to Japanese Patent Application No. 2011-067158 filed. Mar. 25, 2011, the entire content of which is also incorporated herein by reference.

TECHNICAL FIELD

The present invention relates to a photoelectric conversion device and a method for producing the same.

BACKGROUND ART

A photoelectric conversion device such as a solar cell has attracted much attention as an energy source with a low environmental burden. The photoelectric conversion device such as the solar cell faces an important issue of how photoelectric conversion efficiency is to be improved. With a situation like this taken into consideration, a so-called back contact solar cell has been proposed in which a p-type semiconductor region and an n-type semiconductor region are formed on a back-surface side of the solar cell, and a p-side electrode and an n-side electrode are electrically isolated from each other by an isolation trench (refer to Patent Literature 1). According to this back contact solar cell, no electrode exists on a light-receiving surface side, and thus light-receiving efficiency may be heightened to improve photoelectric conversion efficiency.

CITATION LIST

Patent Literature

Patent Literature 1: Japanese Patent Laid-Open Publication No. 2009-200267

SUMMARY OF INVENTION

Technical Problem

In an electrode structure and production method of a back contact solar cell, it is important to make a gap between the electrodes as small as possible to improve power collection efficiency and reflectance of transmitted light using low cost and simple means, as well as to develop a photoelectric conversion device having excellent isolation between the electrodes.

Solution to Problem

A photoelectric conversion device according to the present invention includes a semiconductor substrate, a p-type region and an n-type region formed on one surface of the semiconductor substrate, a p-side electrode including a p-side underlayer formed on the p-type region, a p-side primary conductive layer formed on the p-side underlayer, and a p-side protective layer formed on the p-side primary conductive layer, and an n-side electrode including an n-side underlayer formed on the n-side region, an n-side primary conductive layer formed on the n-side underlayer, and an n-side protective layer formed on the n-side primary conductive layer, wherein the p-side primary conductive layer is formed so as not to cover a lateral surface of the p-side underlayer and has a lateral surface thereof covered by the p-side protective layer, and the n-side primary conductive layer is formed so as not to cover a lateral surface of the n-side underlayer and has a lateral surface thereof covered by the n-side protective layer.

A method for producing a photoelectric conversion device according to the present invention includes the steps of forming a p-type region and an n-type region on one surface of a semiconductor substrate, and forming a p-side electrode and an n-side electrode which are isolated by an isolation trench, the p-side electrode being formed on the p-type region and the n-side electrode being formed on the n-type region respectively, wherein the electrode forming step includes the steps of forming an underlayer and a first primary conductive layer on the p-type region and the n-type region, forming a resist film on an area of the first primary conductive layer corresponding to the isolation trench, forming a p-side second primary conductive layer and an n-side second primary conductive layer respectively so as to be isolated from each other by electrolytic plating using as a seed layer the first primary conductive layer for which the resist film is formed, removing the resist film and etching the first primary conductive layer and the underlayer to form a p-side first primary conductive layer and an n-side first primary conductive layer, and a p-side underlayer and an n-side underlayer respectively, and forming a p-side protective layer and an n-side protective layer respectively by electrolytic plating so as to cover the p-side second primary conductive layer and the n-side second primary conductive layer.

Alternatively, the electrode forming step includes the steps of forming an underlayer and a first primary conductive layer on the p-type region and the n-type region, forming a second primary conductive layer by electrolytic plating using as a seed layer the first primary conductive layer, forming a resist film on the second primary conductive layer with an area corresponding to the isolation trench being left, etching the second primary conductive layer in an area not protected by the resist film, the first primary conductive layer, and the underlayer, respectively, and forming a p-side second primary conductive layer and an n-side second primary conductive layer, a p-side first primary conductive layer and an n-side first primary conductive layer, a p-side underlayer and an n-side underlayer, respectively, and removing the resist film, and forming a p-side protective layer and an n-side protective layer by electrolytic plating to cover the p-side second primary conductive layer and the n-side second primary conductive layer.

Advantage Effects of Invention

According to the preset invention, good isolation between the electrodes may be maintained using low cost and simple means even if a gap between the electrodes is smaller. Since the gap between the electrodes is smaller to extend an electrode area, power collection efficiency and reflectance of transmitted light may be improved to further enhance the photoelectric conversion efficiency, for example.

DESCRIPTION OF EMBODIMENTS

Figure 1:
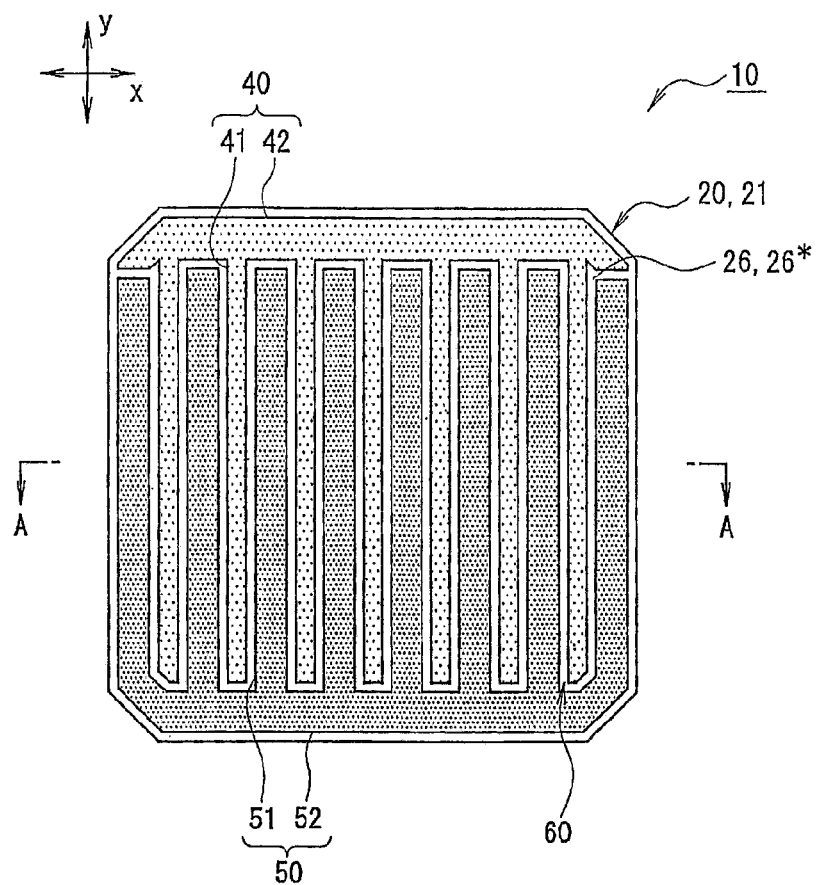
FIG. 1 is a plan view of photoelectric conversion device of an embodiment of the invention seen from a back-surface side.

Hereinafter, embodiments of the present invention are described in detail with reference to the drawings.

The following embodiments are merely described as an illustration. The present invention is not limited to the following embodiments. Further, the drawings referred to in the embodiments are schematically illustrated, and dimensional proportions of objects drawn in the drawings and the like are possibly different from those of real objects. Specific dimensions and the like should be interpreted with the following descriptions taken into consideration.

Firstly, referring to FIG. 1 to FIG. 4, a structure of a photoelectric conversion device 10 is described in detail.

FIG. 1 is a plan view of photoelectric conversion device 10 seen from a back-surface side. As shown in FIG. 1, the photoelectric conversion device 10 includes a photoelectric conversion part 20 which receives light, such as sunlight, to generate carriers (electrons and holes), and an n-side electrode 40 and a p-side electrode 50 which are formed on a back-surface side of the photoelectric conversion part 20. In the photoelectric conversion device 10, the carriers generated in the photoelectric conversion part 20 are collected by the n-side electrode 40 and the p-side electrode 50, respectively. Here, "back-surface" means a surface on an opposite side from "light-receiving surface" on which the light is incident from outside the device. In other words, a surface where the n-side electrode 40 and the p-side electrode 50 are formed is the back-surface.

The n-side electrode 40 and the p-side electrode 50 preferably include a plurality of finger electrode parts 41 and 51 and bus bar electrode parts 42 and 52 for connecting the finger electrode parts with corresponding finger electrode parts, respectively. Then, the bus bar electrode parts 42 and 52 of the electrodes are connected with wiring materials (not shown) to make the photoelectric conversion device 10 into a module, extracting the carrier as electrical energy to the outside.

The photoelectric conversion part 20 has an n-type monocrystalline silicon substrate 21 which is a crystalline semiconductor substrate. The crystalline semiconductor substrate may be, for example, an n-type polycrystalline silicon substrate and a p-type monocrystalline or polycrystalline silicon substrate, but an n-type monocrystalline silicon substrate 21 illustrated in the embodiment is preferably used.

The n-type monocrystalline silicon substrate 21 serves as a power generation layer and has a thickness of 100 to 300 µm, for example. A light-receiving surface of the n-type monocrystalline silicon substrate 21 preferably has a texture structure (not shown) formed thereon. Here, the "texture structure" is a convexo-concave structure in which a surface reflection is restricted to increase an amount of light absorption of the photoelectric conversion part 20. As a specific example of the texture structure, a convexo-concave structure of a pyramid (quadrangular pyramid, or quadrangular truncated pyramid) can be cited, which may be obtained by anisotropically etching the light-receiving surface having a plane direction (100).

Figure 2:
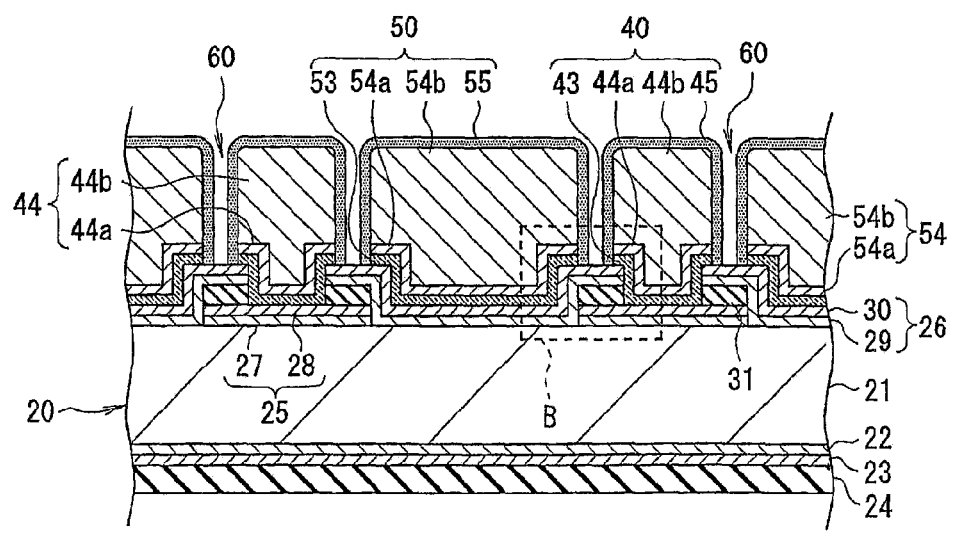
FIG. 2 is a sectional view taken along an A-A line of FIG. 1.

FIG. 2 is a sectional view taken along an A-A line of FIG. 1, that is, a sectional view obtained by sectioning the finger electrode parts 41 and 51 in a width direction. As shown in FIG. 2, the n-type monocrystalline silicon substrate 21 has an i-type amorphous silicon film 22, an n-type amorphous silicon layer 23 and a protective layer 24 formed on the light-receiving surface side in this order. Here, the i-type amorphous silicon layer 22 and the n-type amorphous silicon layer 23 serve as a passivation layer. The protective layer 24 protects the passivation layer and has an anti-reflection function.

The i-type amorphous silicon layer 22 and the n-type amorphous silicon layer 23 are preferably stacked on an entire area of the n-type monocrystalline silicon substrate 21 except for an edge region of the light-receiving surface. The i-type amorphous silicon layer 22 is an intrinsic amorphous silicon thin film layer and has a thickness of about 0.1 nm to 25 nm, for example. On the other hand, the n-type amorphous silicon layer 23 is an amorphous silicon thin film layer doped with phosphorus (P) and the like, for example, and has a thickness of about 2 nm to 50 nm.

The protective layer 24 is stacked on substantially an entire area of the n-type amorphous silicon layer 23. The protective layer 24 is preferably formed of materials having high light transmission, and silicon oxide ($SiO_2$), silicon nitride (SiN), silicon oxynitride (SiON) or the like is used therefor, for example. In this embodiment, a SiN layer is formed as the protective layer 24. A thickness of the protective layer 24 may be adequately changed with the anti-reflection property and the like taken into consideration, but is preferably about 80 nm to 1 μm, for example.

In the photoelectric conversion part 20, the n-type monocrystalline silicon substrate 21 has, stacked on the back-surface side thereof, an IN amorphous silicon layer 25 (hereinafter, referred to as IN layer 25) forming the n-type region and an IP amorphous silicon layer 26 (hereinafter, referred to as IP layer 26) forming the p-type region. A surface of the IN layer 25 is insulated from the IP layer 26 by an insulating layer 31. The IN layer 25 and the IP layer 26 are directly stacked on the back surface of the n-type monocrystalline silicon substrate 21. On the other hand, the insulating layer 31 is stacked on a part of the IN layer 25.

The IN layer 25 includes an i-type amorphous silicon layer 27 stacked on the back surface of the n-type monocrystalline silicon substrate 21 and an n-type amorphous silicon layer 28 stacked on the i-type amorphous silicon layer 27. The i-type amorphous silicon layer 27 and the n-type amorphous silicon layer 28 can be formed to have the same composition and the same thickness as the i-type amorphous silicon layer 22 and the n-type amorphous silicon layer 23, respectively.

The IP layer 26 mainly includes an i-type amorphous silicon layer 29 stacked on the back surface of the n-type monocrystalline silicon substrate 21 and a p-type amorphous silicon layer 30 stacked on the i-type amorphous silicon layer 29. The i-type amorphous silicon layer 29 can be formed to have the same composition and the same thickness as the i-type amorphous silicon layer 22 or the i-type amorphous silicon layer 27, for example. The p-type amorphous silicon layer 30 is an amorphous silicon thin film layer doped with boron (B) and the like. A thickness of the p-type amorphous silicon layer 30 is preferably about 2 nm to 50 nm, for example.

The IN layer 25 and the IP layer 26 are preferably formed alternately along one direction parallel to the back surface in terms of the photoelectric conversion efficiency and the like. Moreover, the IN layer 25 and the IP layer 26 are preferably formed to cover on the back surface of the n-type monocrystalline silicon substrate 21 over a wide range. Therefore, in order to make a part of the IN layer 25 and a part of the IP layer 26 overlap with each other, one layer is preferably stacked on the other layer so as to be overlapped without any gap, for example.

The following description illustrates how the IP layer 26 is stacked on the IN layer 25 in an overlapping manner. Then, a portion where the IN layer 25 and the IP layer 26 overlap with each other is referred to as an "overlapped portion 26*" in the description.

The insulating layer 31 is preferably provided on at least a part in the overlapped portion 26* between the surface of the IN layer 25 and the IP layer 26. The insulating layer 31 serves to improve insulation between the IN layer 25 and the IP layer 26. The insulating layer 31 may be formed to have the same composition and the same thickness as the protective layer 24, for example. Particularly, the SiN layer is preferably used.

The insulating layer 31 is formed on the IN layer 25 for an entire area to be stacked with the IP layer 26, that is, across the overlapped portion 26*. The IN layer 25 does not have the insulating layer 31 stacked on an area where the IP layer 26 is not stacked.

Figure 3:
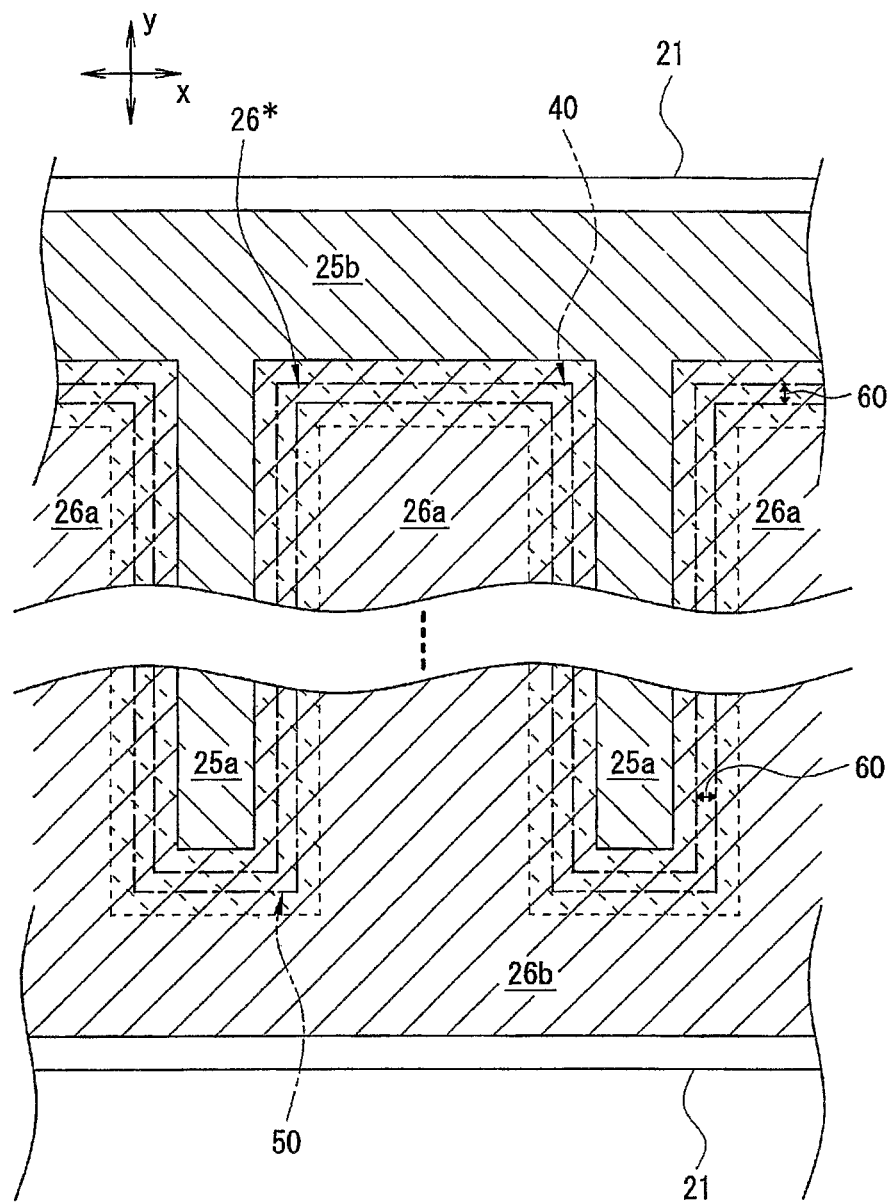
FIG. 3 is a diagram illustrating planar shape patterns of an IN amorphous silicon layer and an IP amorphous silicon layer with an n-side electrode and a p-side electrode in FIG. 1 being omitted.

Here, with reference to FIG. 3, a description is given of a structure of the IN layer 25 and the IP layer 26 in detail. A direction parallel to the back surface where the IN layer 25 and the IP layer 26 are alternately formed is defined as "x direction", and a direction parallel to the back surface orthogonal to the x direction is defined as "y direction", below.

FIG. 3 is a diagram illustrating a planar shape pattern of the IN layer 25 and the IP layer 26 with the n-side electrode 40 and the p-side electrode 50 in FIG. 1 being omitted. FIG. 3 illustrates a part enlarged for the purpose of clarity in the drawing. Furthermore, exposed stacking regions of the IN layer 25 and the IP layer 26 are hatched with solid lines which are different from each other in angle. The stacking region of the IN layer 25 is hatched with a broken line on a region where the IP layer 26 is stacked via the insulating layer 31. A region cross-hatched is the overlapped portion 26*.

As shown in FIG. 3, the IN layer 25 and the IP layer 26 have a pectinate or stripe stacking configuration, for example, formed so as to engage with each other. The IN layer 25 and the IP layer 26 are alternately formed in the x direction. In addition, the IN layer 25 and the IP layer 26 are preferably stacked without any gap such that the overlapped portion 26* is formed.

The IN layer 25 has a plurality of IN regions 25a extending along the y direction and an IN region 25b intersecting and joining with the plurality of IN regions 25a, for example. The IN regions 25a are preferably formed parallel with each other at predetermined intervals in the x direction, for example.

The IP layer 26 has, similarly to the IN layer 25, a plurality of IP regions 26a extending along the y direction and an IP region 26b intersecting and joining with the plurality of IP regions 26a.

The plural IP regions 26a are, similarly to the IN region 25a, formed parallel with each other at predetermined intervals in the x direction. Then, the IP regions 26a are stacked so as to fill between the IN regions 25a, forming the IN layer 25(IN regions 25a) and the IP layer 26 (IP regions 26a) alternately along the x direction as described above. Moreover, the edge region in the x direction of the IP region 26a is stacked on the edge region in the x direction of the IN region 25a to form the plurality of overlapped portions 26*.

The IN layer 25 and the IP layer 26 are preferably also formed in the y direction on the back surface of the n-type monocrystalline silicon substrate 21 without any gap. For example, a part of the IP layer 26 is preferably stacked on a part of the IN layer 25 in a boundary region between the IN layer 25 and the IP layer 26 in the y direction. Specifically, the IN layer 25 and the IP layer 26 are stacked on an entire area of the back surface of the n-type monocrystalline silicon substrate 21.

A width of the overlapped portion 26* is about 30 μm to 500 μm, for example, and preferably set to about one third of a width of the IN region 25a. The width of the IN region 25a may be preferably about 100 μm to 1.5 mm. The interval between the IN regions 25a may be set larger than the width thereof, and a width of the IP region 26a is set larger than that of the IN region 25a, for example. Additionally, widths of the IN region 25b and the IP region 26b may be set larger than that of the IP region 26a, for example.

Figure 4:
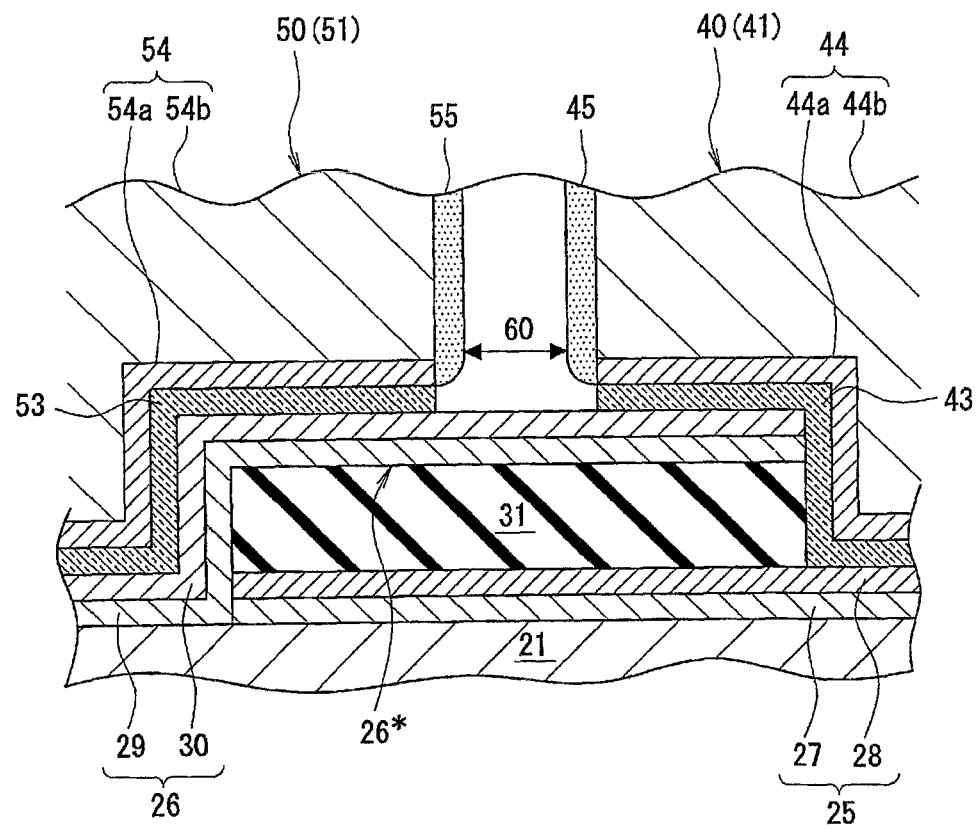
FIG. 4 is an enlarged view of a part B of FIG. 2.

Here, a detailed description is given of a structure of the n-side electrode 40 and the p-side electrode 50 with reference to FIG. 1 to FIG. 3 as well as FIG. 4, as appropriate. FIG. 4 is an enlarged view of a part B of FIG. 2, illustrating a position and the vicinity of a boundary between the n-side electrode 40 and the p-side electrode 50.

The n-side electrode 40 is an electrode to collect the carriers (electrons) from the IN amorphous silicon layer 25 in the photoelectric conversion part 20. The n-side electrode 40 is formed directly on the IN layer 25. The A-side electrode 50 is an electrode to collect the carriers (holes) from the IP amorphous silicon layer 26 in the photoelectric conversion part 20. The p-side electrode 50 is formed directly on the IP layer 26. In this embodiment, a stacking area of the IP layer 26 is larger than a stacking area of the IN layer 25, in accordance with which a stacking area of the p-side electrode 50 becomes larger than a stacking area of the n-side electrode 40.

An isolation trench 60 is formed between the n-side electrode 40 and the p-side electrode 50 which isolates these electrodes from one another. The isolation trench 60 is preferably formed on the IP layer 26. The isolation trench 60 is preferably formed on the overlapped portion 26*.

In the n-side electrode 40, for example, the finger electrode part 41 is formed on an exposed area of the IN region 25a and the bus bar electrode part 42 is formed on an exposed area of the IN region 25b, respectively. Each of the electrode parts is also formed on the overlapped portion 26*. On the other hand, in the p-side electrode 50, for example, the finger electrode part 51 is formed on the IP region 26a and the bus bar electrode part 52 is formed on the IP region 26b. Each of these electrode parts is also formed on the overlapped portion 26*.

The n-side electrode 40 has a stacking structure including an n-side underlayer 43 formed on the IN layer 25, an n-side primary conductive layer 44 formed on the n-side underlayer 43, and an n-side protective layer 45 formed on the n-side primary conductive layer 44. The p-side electrode 50 has a stacking structure including a p-side underlayer 53 formed on the IP layer 26, a p-side primary conductive layer 54 formed on the p-side underlayer 53, and a p-side protective layer 55 formed on the p-side primary conductive layer 54.

The primary conductive layers 44 and 54, and the protective layers 45 and 55 are preferably a metal layer, and the underlayers 43 and 53 are preferably a transparent conducting oxide layer (TCO film). The transparent conducting oxide layer serves to prevent contact between the photoelectric conversion part 20 and the metal layer in order to prevent the metal layer and the semiconductor being alloyed to improve reflectance of the incident light.

The transparent conducting oxide layer (TCO film) is preferably a structure to include at least one of metal oxides having a polycrystalline structure such as indium oxide ($In_2O_2$), zinc oxide (ZnO), tin oxide ($SnO_2$), and titanium oxide ($TiO_2$), for example. These metal oxides doped with a dopant such as tin (Sn), zinc (Zn), tungsten (W), antimony (Sb), titanium (Ti), aluminum (Al), cerium (Ce), and gallium (Ga) may be used, and, for example, the ITO having $In_2O_2$ doped with Sn is particularly preferable. A concentration of the dopant may be 0 to 20 wt %. A thickness of the transparent conducting oxide layer is preferably about 50 nm to 100 nm, for example.

The metal layer is preferably constituted by a metal having high electrical conductivity and high light reflectance. Moreover, the metal layer can be particularly preferably formed by electrolytic plating. Specifically, a metal such as titanium (Ti), aluminum (Al), nickel (Ni), tin (Sn), copper (Cu), silver (Ag), and gold (Au), or an alloy including one or more thereof may be cited as an example.

The primary conductive layers 44 and 54 are particularly preferably a Cu layer in terms of the electrical conductivity, reflectance, material cost and the like, for example. A thickness of the Cu layer is preferably about 10 µm to 20 µm, for example. Further, the n-side primary conductive layer 44 is preferably constituted by an n-side first primary conductive layer 44a formed on the n-side underlayer 43 and an n-side second primary conductive layer 44b formed by electrolytic-plating using as a seed layer the n-side first primary conductive layer 44a. Similarly, the p-side primary conductive layer 54 is preferably constituted by a p-side first primary conductive layer 54a and a p-side second primary conductive layer 54b. Here, the "seed layer" means a layer in which current flows when the plating is grown, and the second primary conductive layers 44b and 54b are formed on the respective seed layers.

As shown in FIG. 4, the n-side primary conductive layer 44 is formed so as not to cover a lateral surface of the n-side underlayer 43. Similarly, the p-side primary conductive layer 54 is formed so as not to cover a lateral surface of the p-side underlayer 53.

The protective layers 45 and 55 serve to prevent the Cu layer from being oxidized to prevent the conductivity from being decreased, for example. As the protective layers 45 and 55, a Sn layer is preferably used which is changed less in conductivity due to oxidation and is lower in cost, but an Ag layer or an Au layer that is harder to oxidize than Cu may be used. A thickness of the protective layers 45 and 55 is preferably about 1 µm to 5 µm, for example.

The n-side primary conductive layer 44 preferably has a lateral surface covered by the n-side protective layer 45. Similarly, the p-side primary conductive layer 54 preferably has a lateral surface covered by the p-side protective layer 55.

Next, referring to FIG. 5 to FIG. 17, a method for producing the photoelectric conversion device 10 is illustrated.

Figure 15:
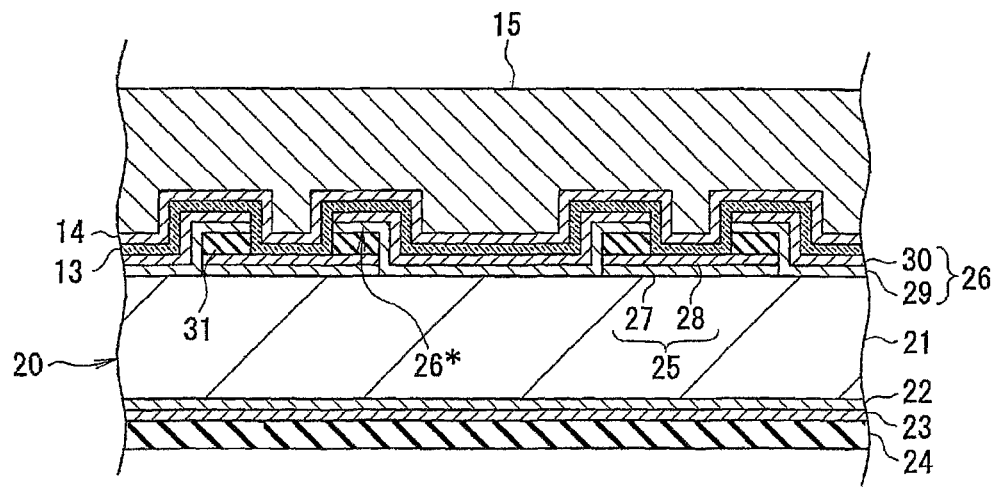
FIG. 15 is a sectional view explaining the method for producing the photoelectric conversion device, which is the embodiment of the invention, showing the forming process of the n-side electrode and the p-side electrode.
Figure 16:
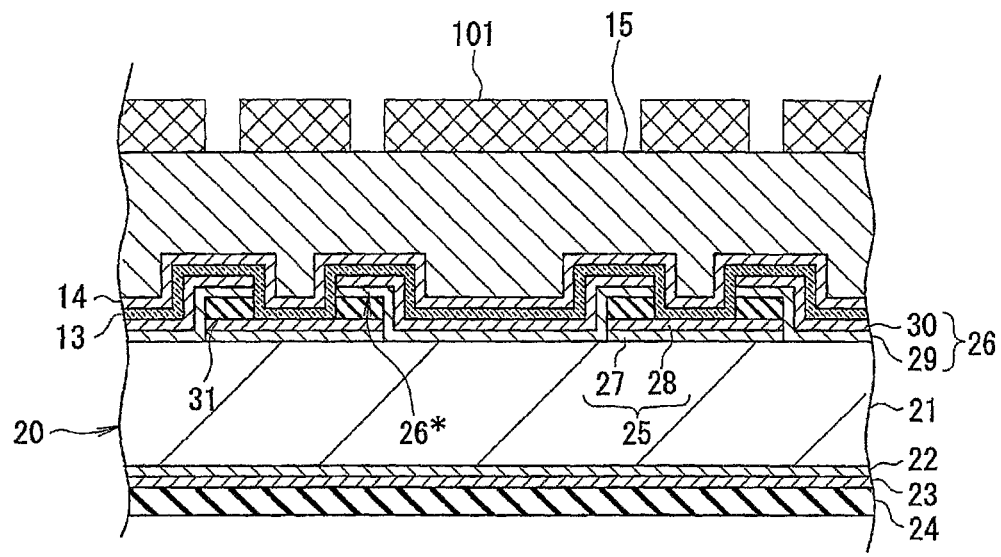
FIG. 16 is a sectional view explaining the method for producing the photoelectric conversion device, which is the embodiment of the invention, showing the forming process of the n-side electrode and the p-side electrode.
Figure 17:
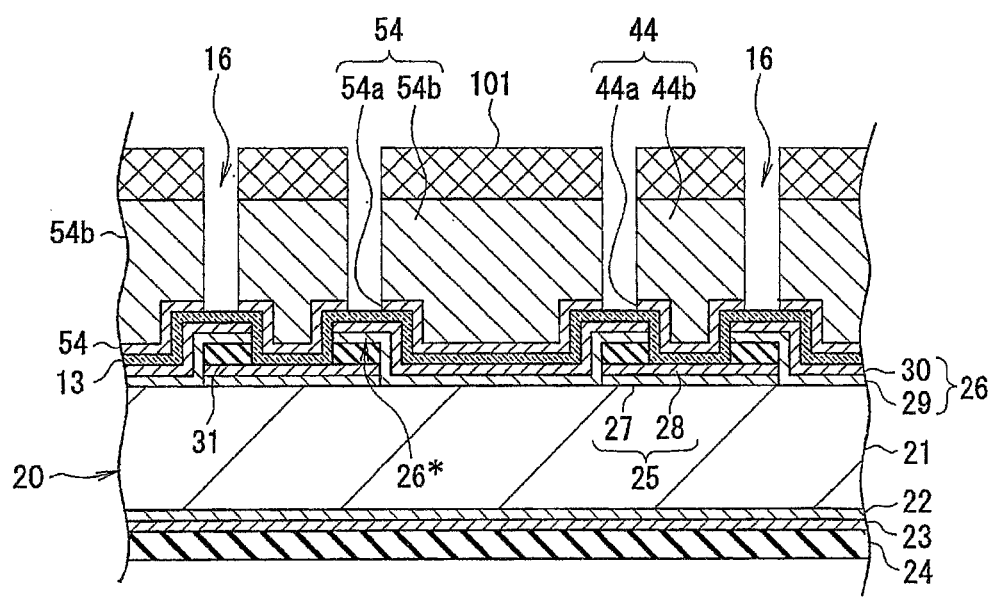
FIG. 17 is a sectional view explaining the method for producing the photoelectric conversion device, which is the embodiment of the invention, showing the forming process of the n-side electrode and the p-side electrode.

FIG. 5 to FIG. 14 are sectional views illustrating a first example of the production process. FIG. 15 to FIG. 17 are sectional views illustrating a second example of the production process. FIG. 5 to FIG. 17 are the sectional views taken along a width direction of the finger electrode parts 41 and 51 similarly to FIG. 2.

First, a description is given of a production process of the photoelectric conversion part 20 with reference to FIG. 5 to FIG. 8.

Figure 5:
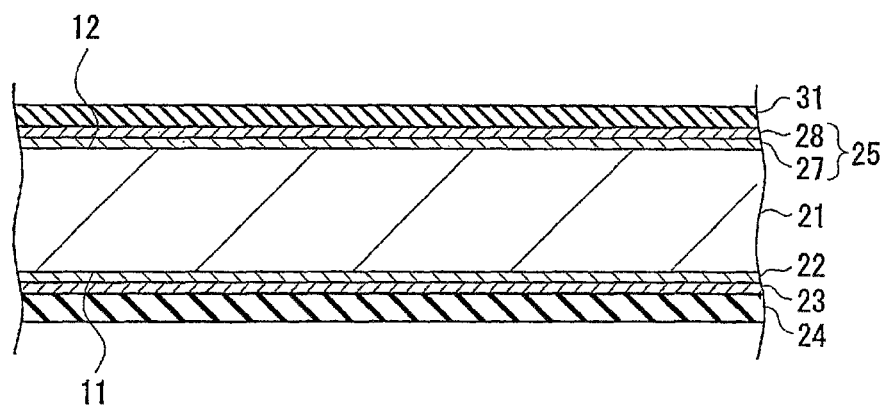
FIG. 5 is a sectional view explaining a method for producing a photoelectric conversion device which is an embodiment of the invention, showing a producing process of a photoelectric conversion part.

As shown in FIG. 5, the n-type monocrystalline silicon substrate 21 is put in a vacuum chamber to stack the i-type amorphous silicon layer, the n-type amorphous silicon layer and the insulating layer (protective layer) in this order by plasma-enhanced chemical vapor deposition (PECVD) or sputtering. In this embodiment, the i-type amorphous silicon layer 22, the n-type amorphous silicon layer 23 and the protective layer 24 are stacked on the light-receiving surface 11 of the n-type monocrystalline silicon substrate 21 in this order, and the i-type amorphous silicon layer 27, the n-type amorphous silicon layer 28, and the insulating layer 31 are stacked on the back surface 12 in this order.

In a stacking process of the i-type amorphous silicon films 22 and 27 by PECVD, silane gas ($SiH_4$) which is diluted with hydrogen ($H_2$) is used as a material gas, for example. In addition, in the stacking process of the n-type amorphous silicon films 23 and 28, silane ($SiH_4$) which is added with phosphine ($PH_3$) and diluted with hydrogen ($H_2$) is used as a material gas, for example.

Prior to stacking the i-type amorphous silicon layer 22 and the like, the texture structure is preferably formed on the light-receiving surface 11 of the n-type monocrystalline silicon substrate 21. The texture structure may be formed by anisotropically etching the plane direction (100) using a potassium hydroxide (KOH) aqueous solution, for example.

Figure 6:
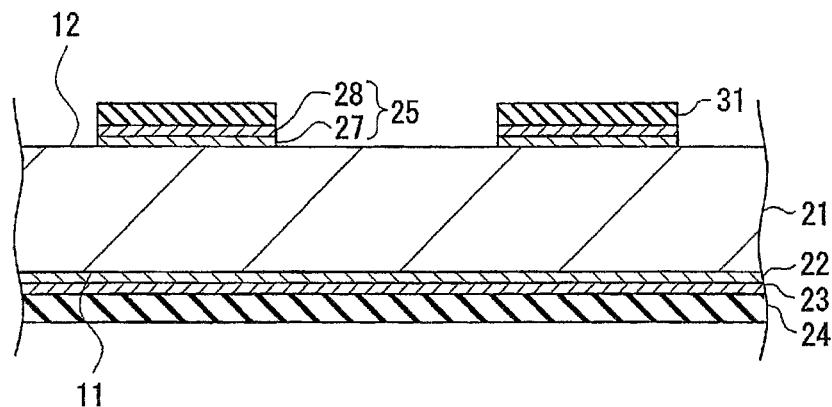
FIG. 6 is a sectional view explaining the method for producing the photoelectric conversion device which is the embodiment of the invention, showing the producing process of the photoelectric conversion part.

Subsequently, as shown in FIG. 6, each layer stacked on the back surface 12 is patterned. Firstly, the insulating layer 31 is partially etched and removed. In an etching process of the insulating layer 31, a resist film is used as a mask which is formed in a coating process by screen printing and ink-jet, a photolithography process or the like, for example. In the case where the insulating layer 31 is silicon oxide ($SiO_2$), silicon nitride (SiN), or silicon oxynitride (SiON), etching may be carried out using a hydrogen fluoride (HF) aqueous solution, for example.

After the insulating layer 31 is etched, the resist film is removed and the exposed IN layer 25 is etched using the patterned insulating layer 31 as a mask, for example. The etching of the IN layer 25 is carried out by use of an alkaline etchant such as a sodium hydroxide (NaGH) aqueous solution (for example, 1 wt % NaOH aqueous solution), for example. This process allows the IN layer 25 and the insulating layer 31 which are patterned to be formed on the back surface 12.

For the etching of the IN layer 25, the IP layer 26, and the insulating layer 31, an etching paste or an etching ink having a viscosity adjusted may be used, for example. In this case, the etching paste is coated on the removed region of the IN layer 25 and others by screen printing, ink-jet and the like.

Figure 7:
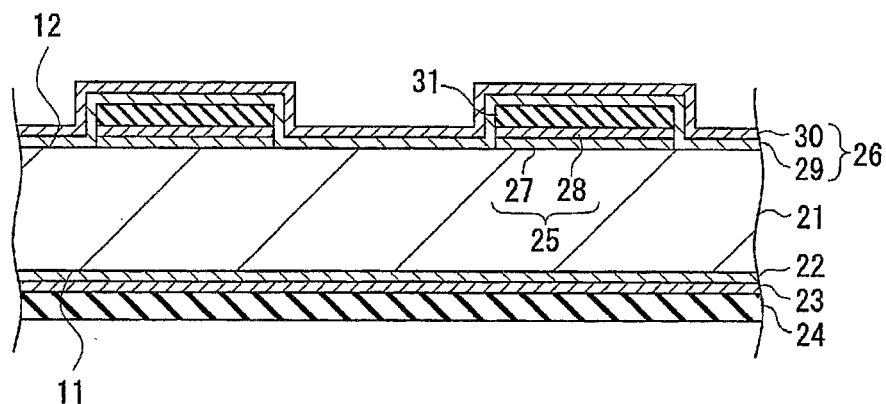
FIG. 7 is a sectional view explaining the method for producing the photoelectric conversion device, which is the embodiment of the invention, showing the producing process of the photoelectric conversion part.

Subsequently, as shown in FIG. 7, the IP layer 26 is stacked on an entire area of the back surface 12 except for the edge region. Specifically, the IP layer 26 is stacked also on the patterned IN layer 25 via the insulating layer 31. The IP layer 26 may be formed, similarly to the IN layer 25, by forming films of the i-type amorphous silicon layer 29 and the p-type amorphous silicon layer 30 in this order using PECVD. However, in the stacking process of the p-type amorphous silicon layer 30, diborane ($B_2H_6$) is used as a material gas instead of $PH_3$, for example.

Figure 8:
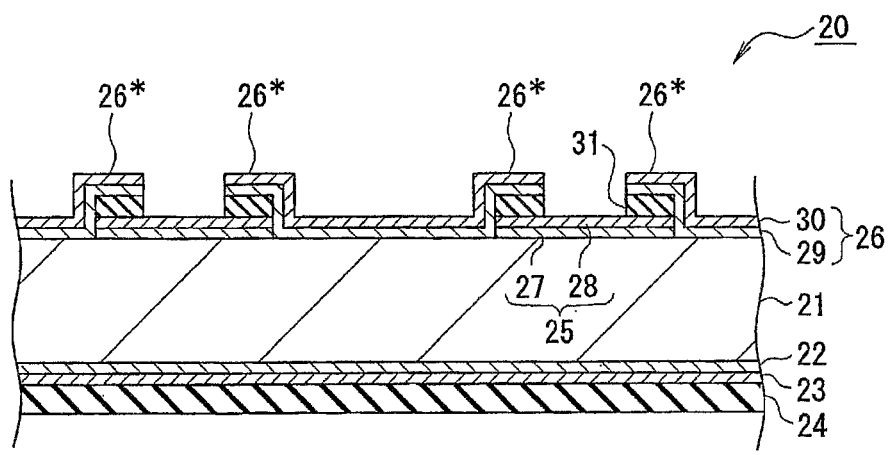
FIG. 8 is a sectional view explaining the method for producing the photoelectric conversion device, which is the embodiment of the invention, showing the producing process of the photoelectric conversion part.

Subsequently, as shown in FIG. 8, the IP layer 26 stacked on the IN layer 25 is patterned and the insulating layer 31 is partially removed to obtain the photoelectric conversion part 20. In this process, firstly, the IP layer 26 stacked on the IN layer 25 is partially etched and removed. An area to be removed on the IP layer 26 is an area to have the n-side electrode 40 formed on the IN layer 25 in the post process. The etching process of the IP layer 26 is carried out by use of an alkaline etchant such as a NaOH aqueous solution using as a mask the resist film formed by screen printing and the like, for example. In this process, an area where the resist film is formed to be protected is the overlapped portion 26* of the IP layer 26 and the area where the IN layer 25 has been removed.

For the IP layer 26, which is generally harder to etch than the IN layer 25, preferably used are the NaOH aqueous solution having a viscosity higher than for the IN layer 25 (for example, 10 wt % NaOH aqueous solution) or fluonitric acid (HF, $HNO_3$) (for example, each 30 wt %). Alternatively, a NaOH aqueous solution heated to about 70 to 90° C. is also preferably used (hot alkaline treatment).

Next, after the IP layer 26 is etched, the resist film is removed and the exposed insulating layer 31 is etched and removed by use of an HF aqueous solution using the patterned IP layer 26 as a mask. Then, removal of a part of the insulating layer 31 allows a part of the IN layer 25 to be exposed.

Next, a description is given of an electrode forming process referring to FIG. 9 to FIG. 14.

Figure 9:
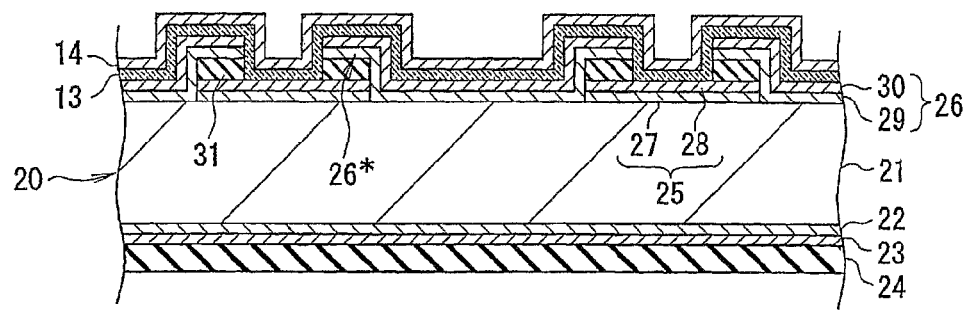
FIG. 9 is a sectional view explaining the method for producing the photoelectric conversion device, which is the embodiment of the invention, showing a forming process of the n-side electrode and the p-side electrode.

As shown in FIG. 9, the underlayer 13 and a first primary conductive layer 14 are formed in this order on the IN layer 25 and the IP layer 26. The underlayer 13 and the first primary conductive layer 14 are stacked on an entire area of the IN layer 25 and IP layer 26.

Figure 10:
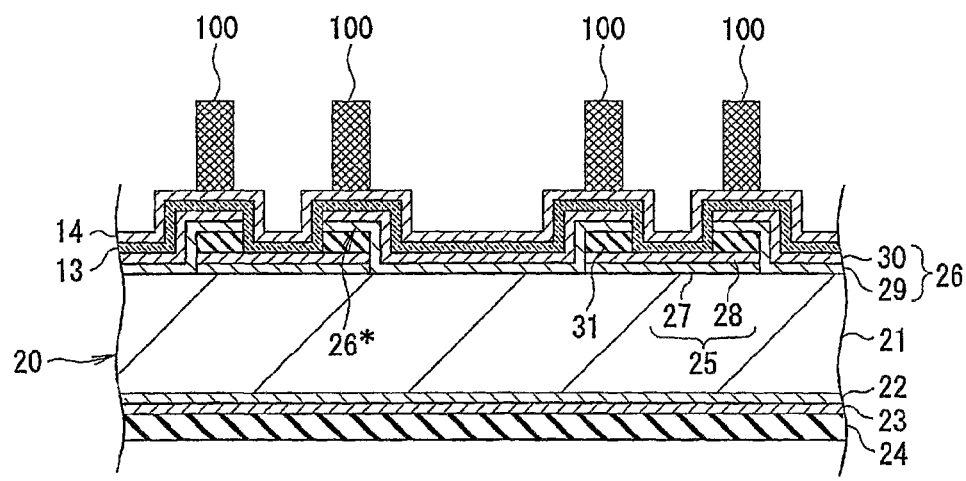
FIG. 10 is a sectional view explaining the method for producing the photoelectric conversion device which is the embodiment of the invention, showing the forming process of the n-side electrode and the p-side electrode.

Subsequently, as shown in FIG. 10, a resist film 100 is formed on the first primary conductive layer 14 on an area corresponding to the isolation trench 60. The resist film 100 is formed on the first primary conductive layer 14 along an area corresponding to the overlapped portion 26*.

A thickness of the resist film 100 is adjusted depending on thicknesses of the n-side second primary conductive layer 44b and p-side second primary conductive layer 54b formed in the post process. The resist film 100 is preferably formed thicker than the second primary conductive layers 44b and 54b in terms of preventing a lateral direction growth of the second primary conductive layers 44b and 54b, for example. Specifically, about 10 μm to 20 μm is preferable. A width of the resist film 100 is preferably smaller so long as the n-side protective layer 45 and the p-side protective layer 55 are not in contact with each other, and is preferably about 10 to 200 μm, for example.

Figure 11:
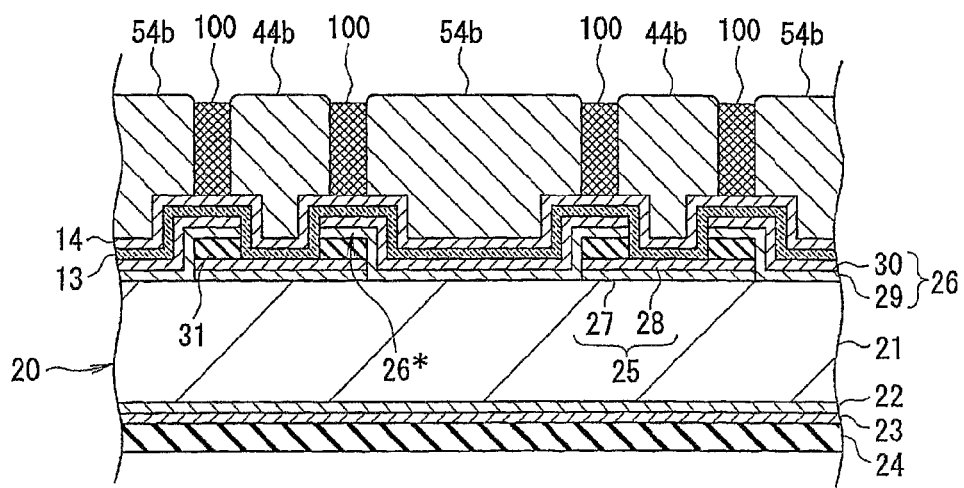
FIG. 11 is a sectional view explaining the method for producing the photoelectric conversion device, which is the embodiment of the invention, showing the forming process of the n-side electrode and the p-side electrode.

Subsequently, as shown in FIG. 11, the n-side second primary conductive layer 44b and the p-side second primary conductive layer 54b are formed by electrolytic plating using as a seed layer the first primary conductive layer 14 having the resist film 100 formed. Here, since plated layers are formed to be divided by the resist film 100, the plated layers are isolated from one another to obtain the second primary conductive layers 44b and 54b. In addition, in this process, the first primary conductive layer 14 is not patterned so that surface density of current flowing in a plate processing is even to substantially equalize the thicknesses of the second primary conductive layers 44b and 54b.

Figure 12:
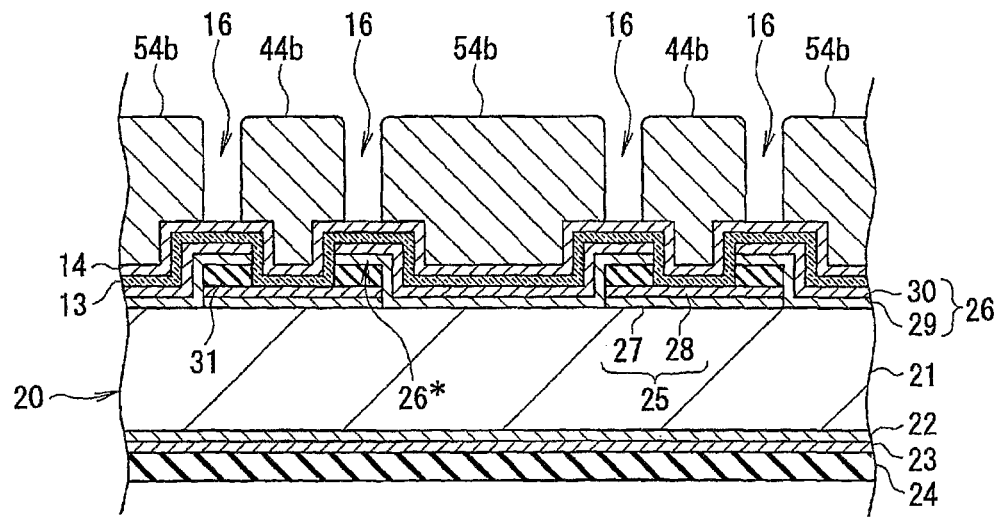
FIG. 12 is a sectional view explaining the method for producing the photoelectric conversion device, which is the embodiment of the invention, showing the forming process of the n-side electrode and the p-side electrode.

Subsequently, as shown in FIG. 12, the resist film 100 is removed. Removal of the resist film 100 allows an isolation trench 16 to be obtained. Here, the isolation trench 16 is a trench for isolating the second primary conductive layers 44b and 54b from one another, and a part thereof is filled with the protective layers 45 and 55 in the post process.

Figure 13:
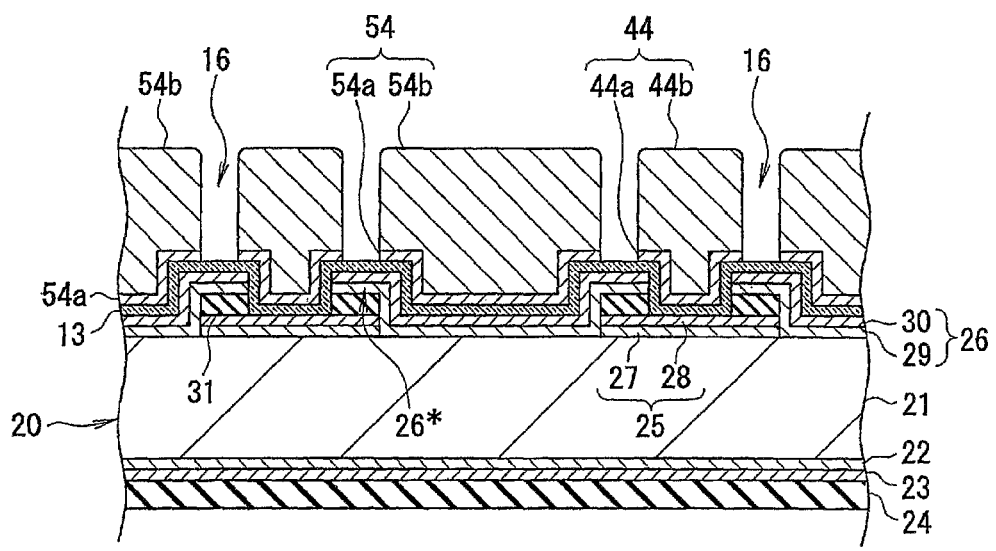
FIG. 13 is a sectional view explaining the method for producing the photoelectric conversion device, which is the embodiment of the invention, showing the forming process of the n-side electrode and the p-side electrode.

Subsequently, as shown in FIG. 13, the first primary conductive layer 14 is partially etched using as a mask the n-side second primary conductive layer 44b and the p-side second primary conductive layer 54b. This allows the first primary conductive layer 14 to be divided at the bottom of the isolation trench 16, forming the n-side first primary conductive layer 44a and the p-side first primary conductive layer 54a isolated from one another. The first primary conductive layer 14 may be etched by use of a ferric chloride ($Fe_2Cl_3$) aqueous solution, for example.

This process obtains the n-side primary conductive layer 44 as a Cu layer including the n-side first primary conductive layer 44a and the n-side second primary conductive layer 44b, and the p-side primary conductive layer 54 as a Cu layer including the p-side first primary conductive layer 54a and the p-side second primary conductive layer 54b. In addition, this process allows a part of the underlayer 13 as a transparent conducting oxide layer to be exposed along the overlapped portion 26*, for example.

Figure 14:
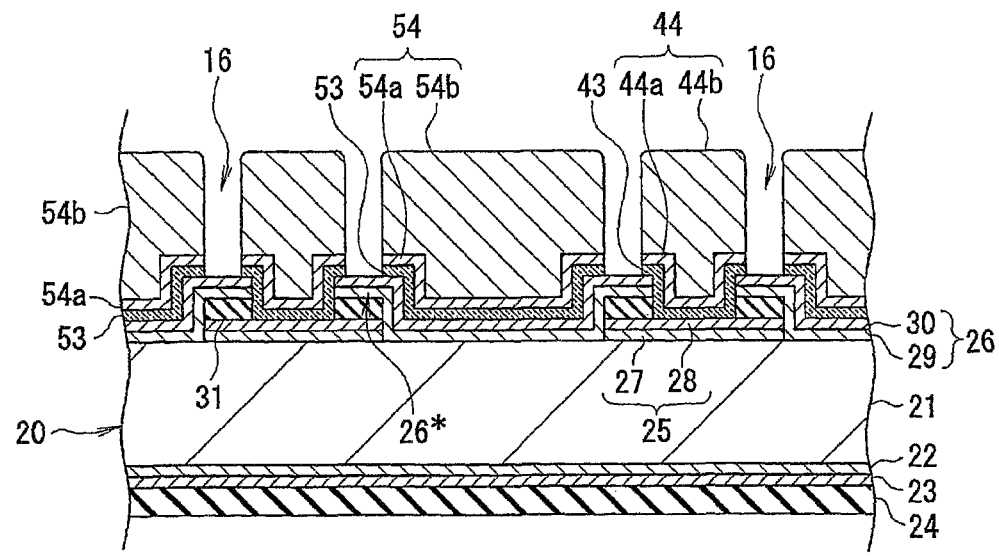
FIG. 14 is a sectional view explaining the method for producing the photoelectric conversion device, which is the embodiment of the invention, showing the forming process of the n-side electrode and the p-side electrode.

Subsequently, as shown in FIG. 14, the exposed underlayer 13 is etched using as a mask the n-side primary conductive layer 44 and the p-side primary conductive layer 54. This allows the underlayer 13 to be divided at the bottom of the isolation trench 16, forming the n-side underlayer 43 and the p-side underlayer 53 isolated from one another. The underlayer 13 may be etched by use of a hydrogen chloride (HCl) aqueous solution or an oxalic acid aqueous solution, for example.

In this process, the underlayer 13 is etched under a condition where the n-side primary conductive layer 44 and the p-side primary conductive layer 54 are not etched, for example, by use of an etchant not including ferric chloride ($Fe_2Cl_3$) and the like. Then, using the Cu layer as a mask allows a distance between the n-side underlayer 43 and the p-side underlayer 53 to be equal to a distance between the n-side primary conductive layer 44 and the p-side primary conductive layer 54.

Finally, the n-side protective layer 45 and the p-side protective layer 55 which are the Sn layers are formed by electrolytic plating using as a seed layer the n-side primary conductive layer 44 and the p-side primary conductive layer 54, respectively. This allows the photoelectric conversion device 10 shown in FIG. 2 to be obtained. The protective layers 45 and 55 are formed to cover the entire exposed surfaces of the n-side primary conductive layer 44 and the p-side primary conductive layer 54 including the lateral surfaces. Here, the protective layers 45 and 55, when formed to have a thickness of 1 µm or more, for example, also cover the lateral surfaces of the underlayers 43 and 53 due to the lateral direction growth.

As described above, in the photoelectric conversion device 10 in this embodiment, the n-side primary conductive layer 44 and the p-side primary conductive layer 54 are stacked on the IN layer 25 or on the IP layer 26 via the underlayers 43 and 53 and are not directly contacted with the IN layer 25 or the IP layer 26. This allows the metals constituting the primary conductive layers 44 and 54 to be prevented from being dispersed into the IN layer 25 or the IP layer 26, for example, restricting occurrence of defects.

Further, in the photoelectric conversion device 10, the n-side primary conductive layer 44 and the p-side primary conductive layer 54 have the entire exposed surfaces including lateral surfaces covered by the n-side protective layer 45 and the p-side protective layer 55, respectively. This allows the metals such as Cu constituting the primary conductive layers 44 and 54 to be prevented from oxidizing and decreasing the electrical conductivity, for example.

Moreover, the production method in this embodiment may form the n-side primary conductive layer 44 and the p-side primary conductive layer 54 to be isolated by carrying out electrolytic plating with the width of the isolation trench 60 being secured using the resist film 100 formed to correspond to a position of the isolation trench 60. Therefore, the distance between the seed layers does not need to be set wider with the lateral direction growth of the Cu plated layer taken into consideration. That is, good isolation between the electrodes is maintained while the width of the isolation trench 60 may be made smaller to extend an electrode area.

Here, referring to FIG. 15 to FIG. 17, a description is given of another example of the method for producing the photoelectric conversion device 10. FIG. 15 to FIG. 17 are diagrams illustrating a part of the electrode forming process.

After the underlayer 13 and the first primary conductive layer 14 are formed in this order on the exposed IN layer 25 and the patterned IP layer 26 as shown in FIG. 9, a second primary conductive layer 15 may be formed on an entire area of the first primary conductive layer 14 as shown in FIG. 15. The second primary conductive layer 15 is the Cu layer, for example, and is formed by electrolytic plating using as a seed layer the first primary conductive layer 14.

Subsequently, as shown in FIG. 16, a resist film 101 is formed on an entire area of the second primary conductive layer 15 except for the area corresponding to the isolation trench 60. In this process, for example, the resist film 101 is formed on the second primary conductive layer 15 with a liner area along the overlapped portion 26* being left. The resist film 101 may be formed by screen printing and the like, for example.

Subsequently, as shown in FIG. 17, the first primary conductive layer 14 and the second primary conductive layer 15 are partially etched, using the resist film 101 as a mask, and these etched parts are exposed and not protected by the resist film 101. This allows the first primary conductive layer 14 and the second primary conductive layer 15 to be divided to form the isolation trench 16 and obtain the n-side primary conductive layer 44 and the n-side protective layer 45 isolated from one another by the isolation trench 16. The first primary conductive layer 14 and the second primary conductive layer 15 may be etched using a ferric chloride ($Fe_2Cl_3$) aqueous solution as described above.

Subsequently, the resist film 101 is removed to lead to a state shown in FIG. 13. The etching process of the underlayer 13 and subsequent processes are as described above.

The method shown in FIG. 15 to FIG. 17 may form the n-side primary conductive layer 44 and p-side primary conductive layer 54 by isolating after forming the Cu plated layer on the entire area of the IN layer 25 and IP layer 26. With this method also, like the case where the Cu plated layer is formed using the Cu seed layers patterned corresponding to the electrodes respectively, the distances between the seed layers do not need to be set wider with the lateral direction growth of the Cu plated layer taken in to consideration. That is, good isolation between the electrodes is maintained while the width of the isolation trench 60 may be made smaller to extend an electrode area.

This embodiment may be changed in design without impairing the intention of the present invention.

For example, this embodiment describes that the IN layer 25 is stacked and thereafter the IP layer 26 is stacked, but the IP layer 26 may be stacked first. In this case, it may be preferable to have a stacking structure in which a part of the IN layer 25 overlaps a part of the IP layer 26.

Further, in this embodiment, the IN layer 25 and the IP layer 26 are stacked on the back surface 12 of the n-type monocrystalline silicon substrate 21 in the pectinate pattern so as to engage with each other, for example, to form the n-type region and the p-type region. However, the regions may be formed by thermally diffusing the dopant. For example, it may be allowed that an n-type dopant is thermally diffused on one area on the back surface 12 to form the n-type region having high dope, and a p-type dopant is thermally diffused on another area to form the p-type region.

Reference Signs List 10 photoelectric conversion device, 11 light-receiving surface, 12 back surface, 13 underlayer, 14 first primary conductive layer, 15 second primary conductive layer, 16 isolation trench, 20 photoelectric conversion part, 21 n-type monocrystalline silicon substrate, 22, 27, 29 i-type amorphous silicon layer, 23, 28 n-type amorphous silicon layer, 24 protective layer, 25 IN amorphous silicon layer (IN layer), 26 IP amorphous silicon layer (IP layer), 30 p-type amorphous silicon layer, 31 insulating layer, 40 n-side electrode, 41, 51 finger electrode part, 42, 52 bus bar electrode part, 43 n-side underlayer, 44 n-side primary conductive layer, 44a n-side first primary conductive layer, 44b n-side second primary conductive layer, 45 n-side protective layer, 50 p-side electrode, 53 p-side underlayer, 54 p-side primary conductive layer, 54a p-side first primary conductive layer, 54b p-side second primary conductive layer, 55 p-side protective layer, 60 isolation trench, 100, 101 resist film.

The invention claimed is:
1. A method for producing a photoelectric conversion device, comprising the steps of:
 forming a p-type region and an n-type region on one surface of a semiconductor substrate; and forming a p-side electrode and an n-side electrode which are isolated by an isolation trench, the p-side electrode being formed on the p-type region and the n-side electrode being formed on the n-type region, respectively, wherein the electrode forming step includes the steps of:

forming an underlayer and a first primary conductive layer on the p-type region and the n-type region;

forming a resist film on an area of the first primary conductive layer corresponding to the isolation trench;

forming a p-side second primary conductive layer and an n-side second primary conductive layer, respectively, so as to be isolated from each other, by electrolytic plating using the first primary conductive layer for which the resist film is formed as a seed layer;

removing the resist film and etching the first primary conductive layer and the underlayer to form a p-side first primary conductive layer and an n-side first primary conductive layer, and a p-side underlayer and an n-side underlayer, respectively; and forming a p-side protective layer and an n-side protective layer, respectively, by electrolytic plating so as to cover the p-side second primary conductive layer and the n-side second primary conductive layer.

2. A method for producing a photoelectric conversion device, comprising the steps of:

forming a p-type region and an n-type region on one surface of a semiconductor substrate a p-type region and an n-type region; and forming a p-side electrode and an n-side electrode which are isolated by an isolation trench, the p-side electrode being formed on the p-type region and the n-side electrode being formed on the n-type region, respectively, wherein the electrode forming step includes the steps of:

forming an underlayer and a first primary conductive layer on the p-type region and the n-type region;

forming a second primary conductive layer by electrolytic plating, using the first primary conductive layer as a seed layer;

forming a resist film on the second primary conductive layer with an area corresponding to the isolation trench being left;

etching the second primary conductive layer in an area not protected by the resist film, the first primary conductive layer, and the underlayer, respectively, and forming a p-side second primary conductive layer and an n-side second primary conductive layer, a p-side first primary conductive layer and an n-side first primary conductive layer, a p-side underlayer and an n-side underlayer, respectively; and removing the resist film, and forming a p-side protective layer and an n-side protective layer by electrolytic plating to cover the p-side second primary conductive layer and the n-side second primary conductive layer.

3. The method for producing a photoelectric conversion device according to claim 1 wherein after etching the first primary conductive layer to form the p-side first primary conductive layer and the n-side first primary conductive layer, the underlayer is etched to form the p-side underlayer and the n-side underlayer under a condition different from that for etching the first primary conductive layer.

4. The method for producing a photoelectric conversion device according to claim 2 wherein after etching the first primary conductive layer to form the p-side first primary conductive layer and the n-side first primary conductive layer, the underlayer is etched to form the p-side underlayer and the n-side underlayer under a condition different from that for etching the first primary conductive layer.

5. The method for producing a photoelectric conversion device according to claim 1 wherein the underlayer is a transparent conductive oxide layer, the first primary conductive layer and the second primary conductive layer are Cu layers, and the p-side protective layer and the n-side protective layer are Sn layers.

6. The method for producing a photoelectric conversion device according to claim 2 wherein the underlayer is a transparent conductive oxide layer, the first primary conductive layer and the second primary conductive layer are Cu layers, and the p-side protective layer and the n-side protective layer are Sn layers.

7. The method for producing a photoelectric conversion device according to claim 3 wherein the underlayer is a transparent conductive oxide layer, the first primary conductive layer and the second primary conductive layer are Cu layers, and the p-side protective layer and the n-side protective layer are Sn layers.

8. The method for producing a photoelectric conversion device according to claim 4 wherein the underlayer is a transparent conductive oxide layer, the first primary conductive layer and the second primary conductive layer are Cu layers, and the p-side protective layer and the n-side protective layer are Sn layers.

9. The method for producing a photoelectric conversion device according to claim 1 wherein the semiconductor substrate is a crystalline semiconductor substrate, and the p-type region and the n-type region are configured to include a layer of a p-type amorphous semiconductor and an n-type amorphous semiconductor.

10. The method for producing a photoelectric conversion device according to claim 2 wherein the semiconductor substrate is a crystalline semiconductor substrate, and the p-type region and the n-type region are configured to include a layer of a p-type amorphous semiconductor and an n-type amorphous semiconductor.

* * * * *